(12) United States Patent
Takata (10) Patent No.: US 8,508,014 B2
(45) Date of Patent: Aug. 13, 2013

(54) SOLID-STATE IMAGE SENSOR AND IMAGING DEVICE HAVING CONNECTION PORTIONS IN CIRCUMFERENCE REGION

(75) Inventor: Takuya Takata, Kanagawa (JP)

(73) Assignee: Fujifilm Corporation (JP)

( * ) Notice: Subject to any disclaimer, the term of this patent is extended or adjusted under 35 U.S.C. 154(b) by 168 days.

(21) Appl. No.: 12/948,357

(22) Filed: Nov. 17, 2010

(65) Prior Publication Data

US 2011/0115043 A1 May 19, 2011

(30) Foreign Application Priority Data

Nov. 19, 2009 (JP) ................................ 2009-263909

(51) Int. Cl.
 *H01L 27/146* (2006.01)
 *H01L 31/062* (2006.01)
 *H01L 31/113* (2006.01)
 *H01L 31/0232* (2006.01)

(52) U.S. Cl.
 USPC ........... 257/448; 257/290; 257/432; 257/443; 257/444; 257/E31.073

(58) Field of Classification Search
 USPC ........................................................ 257/444
 See application file for complete search history.

(56) References Cited

U.S. PATENT DOCUMENTS

| 7,310,115 | B2 * | 12/2007 | Tanimoto | 348/372 |
| 7,445,947 | B2 * | 11/2008 | Inuiya | 438/22 |
| 2008/0211954 | A1 * | 9/2008 | Ota | 348/311 |
| 2010/0045838 | A1 * | 2/2010 | Okano | 348/308 |

FOREIGN PATENT DOCUMENTS

| JP | 2002-236054 A | 8/2002 |
| JP | 3588053 | 8/2004 |
| JP | 2005-353626 A | 12/2005 |
| JP | 2006-094263 A | 4/2006 |

* cited by examiner

*Primary Examiner* — Michael Jung
(74) *Attorney, Agent, or Firm* — Studebaker & Brackett PC (57) ABSTRACT

According to an aspect of the invention, a solid-state image sensor having a plurality of pixels includes a plurality of lower electrode, a photoelectric conversion layer, an upper electrode, a wiring portion and a plurality of connection portions. The plurality of lower electrodes respectively corresponds to the plurality of pixels. The photoelectric conversion layer is stacked on the lower electrodes. The upper electrode is stacked on the photoelectric conversion layer. The wiring portion supplies, to the upper electrode, a voltage to generate an electric field between the upper electrode and the lower electrode. The plurality of connection portions connects the wiring portion and the upper electrode. The plurality of connection portions are disposed in a circumference region which is a region other than a sensor region in which a plurality of photoelectric conversion elements are arranged. The plurality of connection portions is disposed in a symmetrical arrangement.

16 Claims, 9 Drawing Sheets

SOLID-STATE IMAGE SENSOR AND IMAGING DEVICE HAVING CONNECTION PORTIONS IN CIRCUMFERENCE REGION

CROSS-REFERENCE TO RELATED APPLICATIONS

This application is based upon and claims the benefit of priority from Japanese Patent Application No. 2009-263909, filed Nov. 19, 2009, the entire contents of which are incorporated herein by reference.

BACKGROUND

1. Technical Field

The present invention relates to a solid-state image sensor and an imaging device.

2. Related Art

Currently, the configuration of solid-state image sensors of a photoelectric conversion layer stacking type in which a photoelectric conversion layer including an organic material or the like that generates an electric charge in accordance with incident light is disposed on the upper side of a semiconductor substrate is proposed. According to this configuration, by disposing the photoelectric conversion layer having high photoelectric conversion efficiency in the upper portion of a readout circuit such as a CMOS, a decrease in the thickness, a high aperture ratio, and high sensitivity of the imaging device may be achieved, which implements superior characteristics. These solid-state image sensors have appropriate characteristics for a miniaturized camera such as a camera phone module, which implements superior characteristics.

A CMOS image sensor that uses a photoelectric conversion layer has a characteristic in which the amount of signal electric charge generated through photoelectric conversion changed by using a voltage (an opposing voltage or a bias voltage) applied to the photoelectric conversion layer (for example, see JP-A-2006-094263 and JP-A-2005-353626). Generally, the voltage applied to the photoelectric conversion layer needs to be high, and accordingly, a high voltage generated using a voltage boosting circuit such as a charge pump method or the like that may be easily integrated with a sensor as an IC for relatively easy miniaturization is applied to the photoelectric conversion layer.

In imaging devices having the above-described configuration, in order to generate the signal electric charge using the photoelectric conversion layer, a configuration in which an upper electrode is disposed in the upper portion of the photoelectric conversion layer, a lower electrode is disposed in the lower portion of the photoelectric conversion layer, a voltage supplying means is connected to the upper electrode, and a voltage may be applied to the photoelectric conversion layer pinched between the upper electrode and the lower electrode is used. At this time, there is a case where only one location as a portion connecting the voltage supplying means and the upper electrode is disposed or a case where there is a plurality of connection portions and the distances from each connection portion to a sensor region are different from one another. In such a case, there is a possibility that the voltages applied to the photoelectric conversion layers of pixels configuring the sensor region are not uniform, and unevenness in the image occurs due to different amounts of a signal electric charge generated in the pixels, whereby the image quality deteriorates.

As a solution of the above-described problems, the wiring, the circuit, the via plug, and the like used for applying voltages are considered to be disposed such that a voltage is uniformly applied to the photoelectric conversion layers of the pixels. However, in consideration of the viewpoint of miniaturization of the pixels, it is especially difficult to form the circuits or the wirings so as to correspond to the pixels.

In JP-A-2005-353626, a configuration in which there is a plurality of photoelectric conversion layers stacked on a substrate, and a wiring, which has a flat shape, for connection with the upper electrode layer is disposed in the circumference portion of the upper electrode for applying a uniform voltage to the photoelectric conversion layers is disclosed. However, by configuring electrodes for supplying voltages in the circumference of the pixel region, the upper side of a semiconductor substrate may not be uniformly coated with a panchromatic (visible wavelength band general type) photoelectric conversion layer or the like, and the manufacturing process becomes complex, which leads to a decrease in the yield ratio and an increase in costs.

As described above, in solid-state image sensors in which a photoelectric conversion layer is stacked on a substrate, there is a room for further enhancement for how to supply the voltages to the upper electrodes used for applying voltages to the photoelectric conversion layer.

The present invention is to provide a solid-state image sensor and an imaging device capable of applying a uniform voltage to the photoelectric conversion layers disposed on the substrate.

SUMMARY OF THE INVENTION

According to an aspect of the invention, a solid-state image sensor having a plurality of pixels includes a plurality of lower electrode, a photoelectric conversion layer, an upper electrode, a wiring portion and a plurality of connection portions. The plurality of lower electrodes respectively corresponds to the plurality of pixels. The photoelectric conversion layer is stacked on the lower electrodes. The upper electrode is stacked on the photoelectric conversion layer. The wiring portion supplies, to the upper electrode, a voltage to generate an electric field between the upper electrode and the lower electrode. The plurality of connection portions connects the wiring portion and the upper electrode. The plurality of connection portions are disposed in a circumference region which is a region other than a sensor region in which a plurality of photoelectric conversion elements are arranged. Each of the photoelectric conversion elements includes one of the lower electrodes, a part of the photoelectric conversion layer corresponding to the one of the lower electrodes and a part of the upper electrode corresponding to the one of the lower electrodes. The plurality of connection portions is disposed in a symmetrical arrangement with respect to the sensor region. The sensor region is located in a center face region of the photoelectric conversion layer.

DETAILED DESCRIPTION

Figure 1:
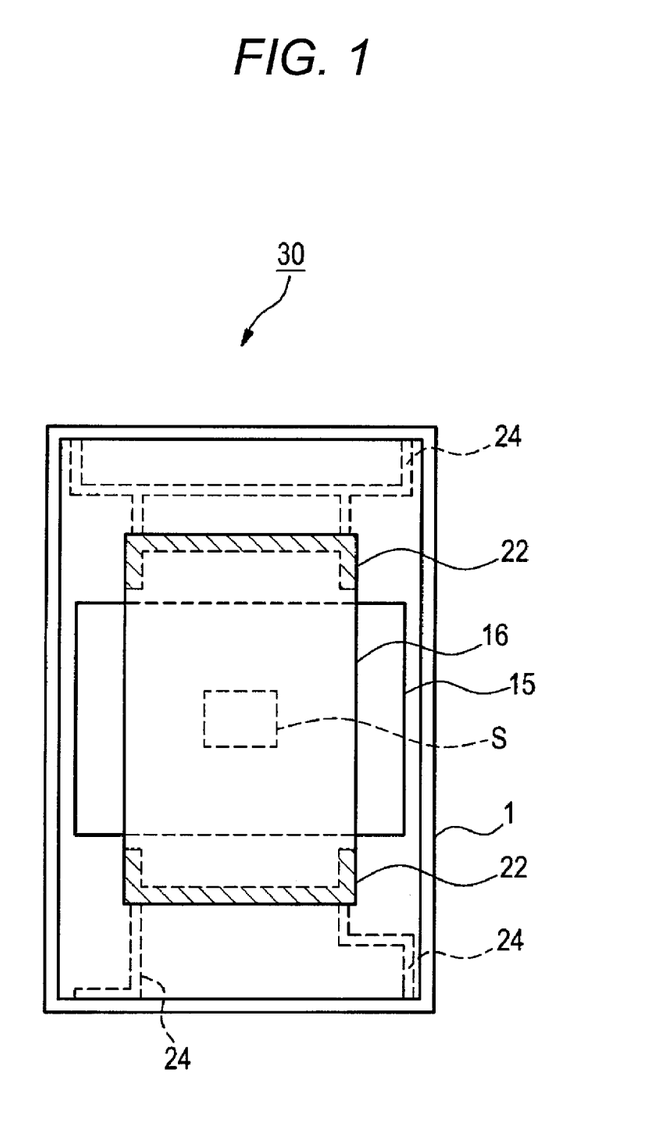
FIG. 1 is a plan view of a solid-state image sensor.
Figure 2:
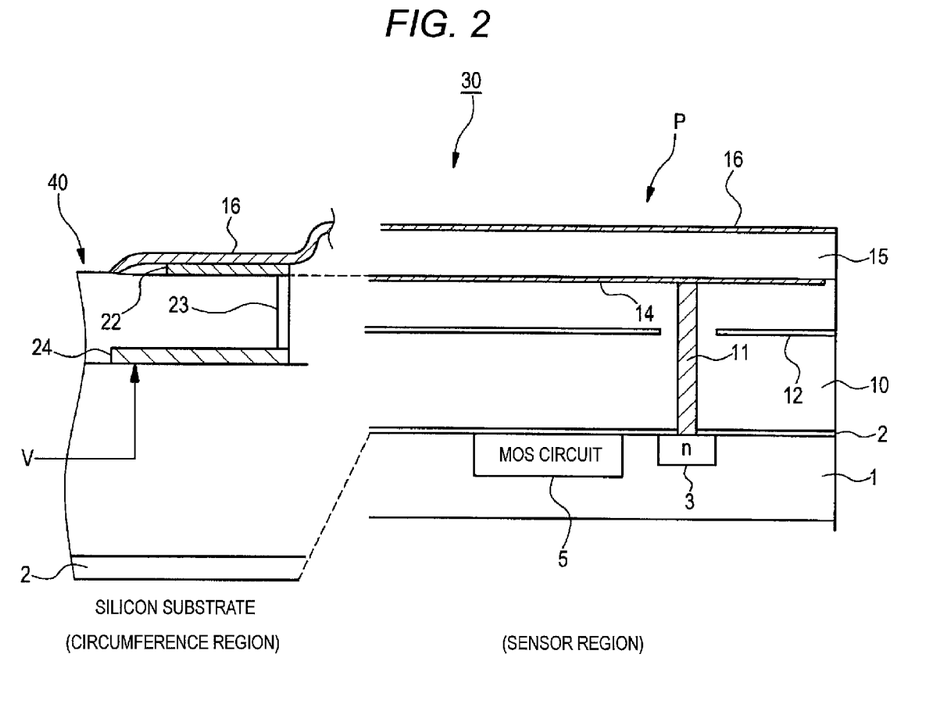
FIG. 2 is a schematic cross-sectional view of one pixel of the solid-state image sensor.
Figure 3:
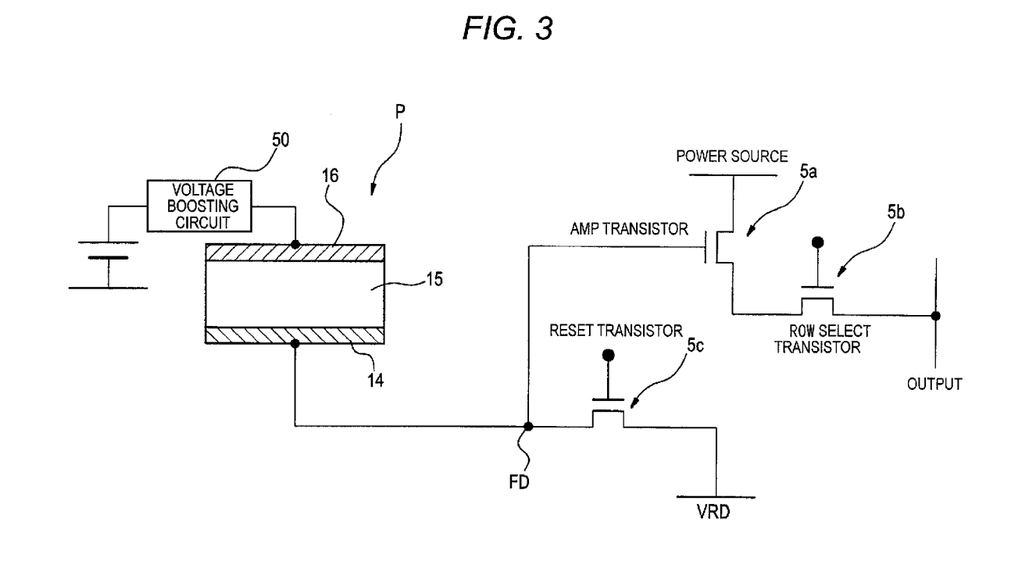
FIG. 3 is a diagram representing an equivalent circuit of the pixel shown in FIG. 2.

FIG. 1 is a plan view of a solid-state image sensor. FIG. 2 is a schematic cross-sectional view of one pixel of the solid-state image sensor. FIG. 3 is a diagram representing an equivalent circuit of the pixel shown in FIG. 2.

The solid-state image sensor 30 shown in FIG. 1 has a p-type silicon substrate 1 (hereinafter, referred to as a substrate 1) that is a semiconductor substrate. The substrate 1 is formed in an approximately rectangular shape in the plan view. In the center portion of the substrate 1 in the plan view, a sensor region S is disposed.

The sensor region S is a region in which a plurality of the pixels shown in FIG. 2 is disposed on the substrate 1 in a two-dimensional pattern. In the substrate 1, a region other than the sensor region S is configured as a circumference region. In the circumference region, a wiring that is used for reading out a signal from the sensor region S, a wiring that is used for supplying a voltage to the sensor region, and the like are formed. The solid-state image sensor 30 is acquired by forming the sensor region S and the circumference region on the substrate 1 as one body in the shape of a chip.

In the substrate 1, a photoelectric conversion layer 15 is formed so as to cover the sensor region S. In addition, a transparent upper electrode 16 is disposed on the photoelectric conversion layer 15.

On the substrate 1, a wiring portion 24 and a plurality of connection portions 22 in which the wiring portion 24 and the upper electrode 16 are electrically connected to each other are formed. In FIG. 1, the connection portions 22 are denoted by diagonal lines.

As shown in FIG. 2, a photoelectric conversion element P that is stacked on the upper side of the substrate 1 through a gate insulating film 2 and an insulating layer 10 are included.

The photoelectric conversion element P is configured so as to include a lower electrode 14 formed on the insulating layer 10, the photoelectric conversion layer 15 formed on the lower electrode 14, and an upper electrode 16 formed on the photoelectric conversion layer 15. The lower electrode 14 is disposed for each photoelectric conversion element P. The photoelectric conversion layer 15 is a single layer and stacked on lower electrode 14. The upper electrode 16 is a single layer that is stacked on the photoelectric conversion layer 15. One photoelectric conversion element P serves as one pixel.

To the upper electrode 16, incident light from a subject is incident from the upper side thereof. As it is necessary for the upper electrode 16 needs to allow the incident light to be incident to the photoelectric conversion layer 15, the upper electrode 16 is composed of a conductive material such as ITO (Indium Tin Oxide) that is transparent to incident light. The upper electrode 16 is configured as one electrode that is common to all the pixels. However, the upper electrode may be divided for each pixel.

The lower electrode 14 is a thin film that is divided for each pixel and is composed of a transparent or opaque conductive material (ITO, aluminum, or the like).

The photoelectric conversion layer 15 is a layer that is composed of an organic or inorganic photoelectric conversion material that absorbs a specific wavelength band of the incident light and generates an electric charge corresponding to the amount of absorbed light. The photoelectric conversion layer 15 is configured as one layer that is common to all the pixels. However, the photoelectric conversion layer may be divided for each pixel. By composing the photoelectric conversion layer 15 of a photoelectric conversion material (for example, quinacridone) that absorbs light of the wavelength band of the color green and generates an electric charge corresponding thereto, visible-light monochrome imaging may be performed. By forming the photoelectric conversion layer 15 of a photoelectric conversion material (for example, a phtalocyanine-based organic material or a naphtalocyanine-based organic material) that absorbs light of the wavelength band of infrared light and generates an electric charge corresponding thereto, infrared-light monochrome imaging may be performed.

FIG. 3 represents the circuit of one pixel. The pixel includes a photoelectric conversion element P, a floating diffusion FD, an output transistor 5a, a selection transistor 5b, and a reset transistor 5c. The output transistor 5a, the selection transistor 5b, and the reset transistor 5c configure a MOS circuit 5 represented in FIG. 5. The output transistor 5a, the selection transistor 5b, and the reset transistor 5c are respectively configured by an n-channel MOS transistor.

The floating diffusion FD is electrically connected to the pixel electrode 14, and the electric potential thereof changes in accordance with the electric potential of the pixel electrode 14. In the example shown in FIG. 4, during an exposure period, a positive voltage VPX is applied to the opposing electrode 16, and the electric potential of the floating diffusion FD rise with the accumulation of signal electric charge during exposure period.

The reset transistor 5c is used for resetting the electric potential of the floating diffusion FD to a predetermined electric potential. The reset transistor 5c has a source terminal that is electrically connected to the floating diffusion FD and a drain terminal to which a reset drain voltage VRD is supplied. When a reset pulse applied to the gate terminal of reset transistor 5c attains a high level, the reset transistor 5c is turned on, and accordingly, the electric potential of the floating diffusion FD is reset to the reset drain voltage VRD.

The output transistor 5a converts the electric potential of the floating diffusion FD into a voltage signal and outputs the voltage signal. In other words, the output transistor 5a outputs a signal corresponding to the amount of electric charge collected in the pixel electrode 14. The output transistor 5a has a gate terminal that is electrically connected to the floating diffusion FD and a drain terminal to which a power source voltage VDD of the MOS circuit 5 is supplied. In addition, the source terminal of the output transistor 5a is connected to the drain terminal of the selection transistor 5b.

The selection transistor 5b is used for selectively outputting an output signal of the output transistor 5a to a signal line S. The source terminal of the selection transistor 5b is connected to the signal line S. When a selection pulse applied to the gate terminal of the selection transistor 5b attains a high level, the selection transistor 5b is turned on. Accordingly, the voltage signal converted by the output transistor 5a is output to the signal line S.

In order to apply a voltage to the photoelectric conversion layer 15, a voltage is supplied to the upper electrode 16 by an outside voltage supplying means. The voltage supplied from the outside is raised through a voltage boosting circuit, and then, the raised voltage is supplied to the upper electrode 16 through the wiring portion. When the voltage is supplied to the upper electrode 16, an electric field is generated between the upper electrode 16 and the lower electrode 14, and signal electric charge is generated by the photoelectric conversion layer 15 that is pinched therebetween.

Figure 4:
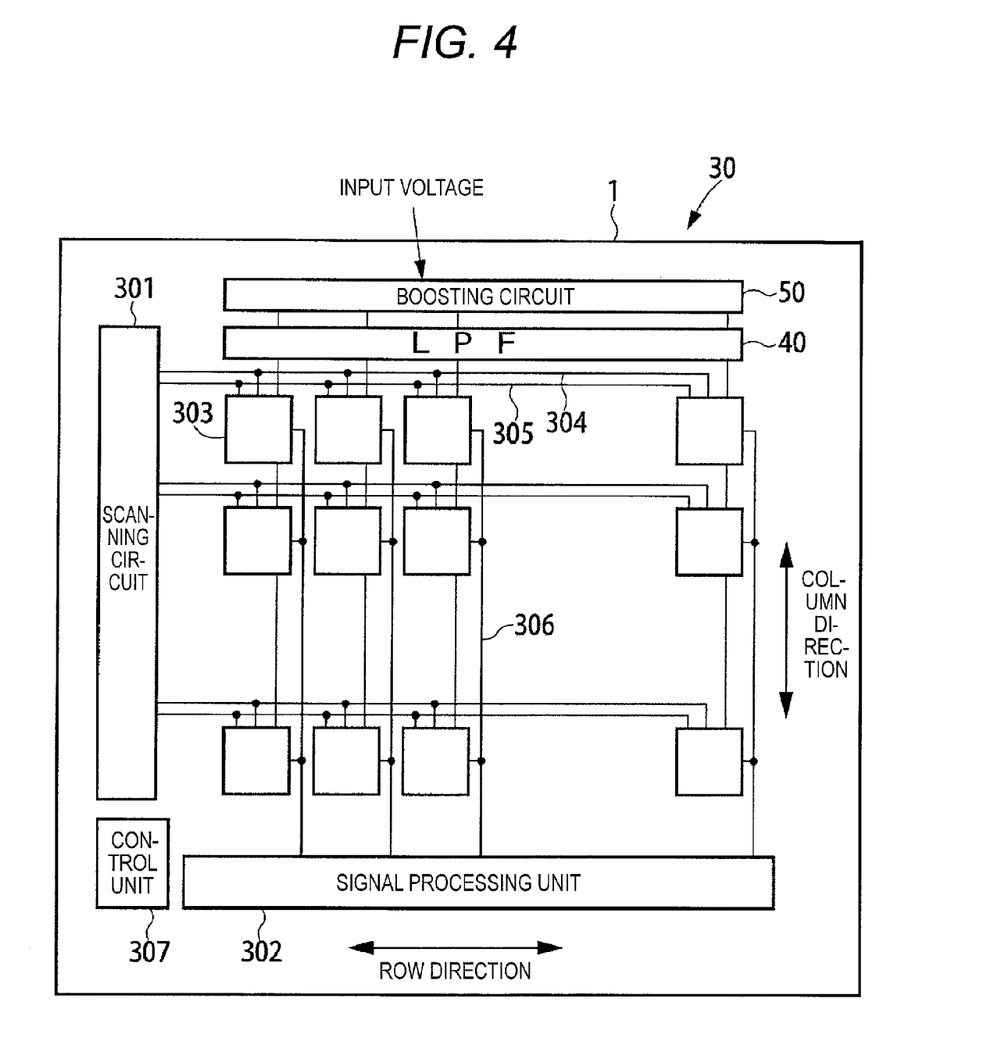
FIG. 4 is a schematic plan view of a solid-state image sensor.

FIG. 4 is a schematic plan view of a solid-state image sensor. The solid-state image sensor 30 includes a plurality of pixels 303 that is arranged in a square lattice shape in the row direction and the column direction perpendicular thereto, a scanning circuit 301 that is used for controlling read-out of a signal from the pixels 303, a signal processing unit 302 that processes the signal output from each pixel 303, and a control unit 307 that controls each unit. The pixel 303 has the configuration shown in FIG. 2.

The scanning circuit 301 is connected to a reset gate 9 of the reset transistor of each pixel 303 through a reset signal line 304 and applies a reset pulse from this reset signal line 304 to each pixel 303. In addition, the scanning circuit 301 is connected to a gate of a row select transistor 5b of each pixel 303 through a row select signal line 305 and applies a row select pulse from this row select signal line 305 to each pixel 303.

The signal processing unit 302 is connected to the output of the row select transistor 5b of each pixel 303 through an output signal line 306, and a signal output from the row select transistor 5b is input to the signal processing unit 302 through this output signal line 306.

In addition, the solid-state image sensor 30 includes a voltage boosting circuit 50 that supplies a power source voltage to the photoelectric conversion element P of each pixel 303 by raising the input voltage through a voltage boosting operation and a low pass filter 40 that is used for suppressing power source noise contained in the power source voltage of the voltage boosting circuit 50. The low pass filter 40 and the voltage boosting circuit 50 are disposed in the circumference region of the substrate 1.

Figure 5:
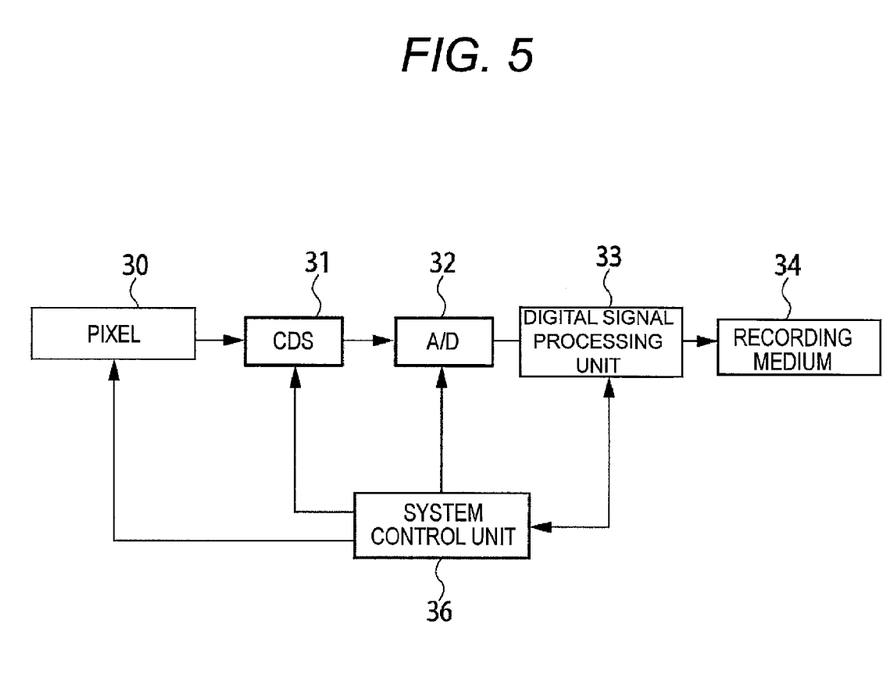
FIG. 5 is a diagram representing an imaging device in which a solid-state image sensor is mounted.

FIG. 5 is a diagram representing an imaging device in which a solid-state image sensor is mounted. This imaging device includes: the pixel 30 shown in FIG. 4; a CDS circuit 31 that performs a correlated double sampling (CDS) process for a signal acquired from each pixel of the solid-state image sensor 30 so as to eliminate noise; an A/D converter 32 that converts an output signal of the CDS circuit 31 into a digital signal; a digital signal processing unit 33 that generates image data by performing predetermined digital signal processing on the digital signal output from the A/D converter 32; a recording medium 34 on which the image data generated by the digital signal processing unit 33 is recorded; and a system control unit 36 that controls the overall operation of the imaging device. In addition, the solid-state image sensor 30, the CDS circuit 31, and the A/D converter 32 may be integrated into one chip (one IC).

Next, the wiring portion and a connection portion of the circumference region will be described.

As shown in FIG. 2, in the circumference region of the substrate 1, the connection portion 22 is disposed on the insulating layer 10 on the upper side of the substrate 1. On the other hand, the wiring portion 24 is configured inside the insulating layer 10, and applied the voltage VPX. The connection portion 22 and the wiring portion 24 are formed from a conductive material. The connection portion 22 and the wiring portion 24 are electrically connected to each other through a via 23 inside the insulating layer 10. On the connection portion 22, a part of the upper electrode 16 is disposed so as to secure an electrical connection between the connection portion 22 and the upper electrode 16.

The wiring portion 22, in the circumference region, may not be disposed in an uppermost portion but may be disposed as a wiring structure which contains two or more layers inside the wiring layer 10 on the upper side of the substrate 1. Accordingly, by using a wiring layer that has resistivity lower than that of the lower electrode 14 material used as the wiring of the uppermost portion, a voltage drop may be decreased by decreasing resistance, whereby the degree of freedom of wiring layout may be acquired.

In addition, by forming the wiring portion 22 inside the insulating layer 10 on the substrate 1 through a via or the like, a voltage may be supplied from an internal power source.

A solid-state image sensor of a photoelectric conversion layer stacking type has a configuration in which other electrodes or wirings do not need to be disposed on the upper side of the semiconductor substrate in the circumference region. Accordingly, by disposing the connection portion 22 and the wiring portion 24 in the circumference region, the connection portion 22 and the wiring portion 24 may be integrated into one chip on the same substrate 1 without influencing the design of other constituent members of the solid-state image sensor 30.

The connection portion 22 and the wiring portion 24 may be formed in the same process by using the same conductive material as that of the photoelectric conversion element P or the wiring layer of the circuit which reads out the electric charge of the photoelectric conversion element P.

For example, the connection portion 22 may be configured by using the same conductive material as that of the lower electrode 14 of the photoelectric conversion element P. At this time, the positions of the connection portion 22 and the lower electrode 14 from the surface of the substrate 1 become the same.

The connection portion 22 may be configured by using a predetermined metal material (top metal) located on the uppermost portion of the circumference region of the semiconductor substrate. As this metal material, a material that may be connected to ITO composing the upper electrode 16 without being oxidized, for example, Cu (copper), Al (aluminum), W (tungsten), Mo (molybdenum), Au (gold), TiN (titanium nitride), or ITO may be used.

Figure 6A:
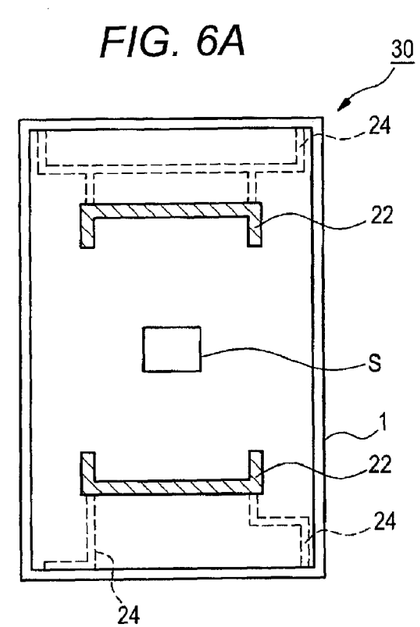
FIGS. 6A to 6C are plan views representing the procedure of producing a solid-state image sensor.
Figure 6B:
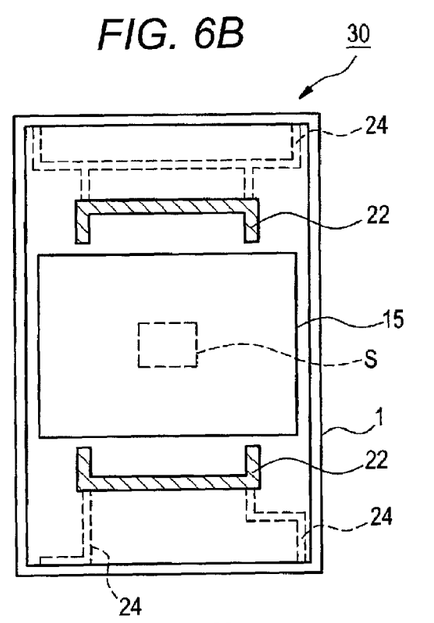
Figure 6C:
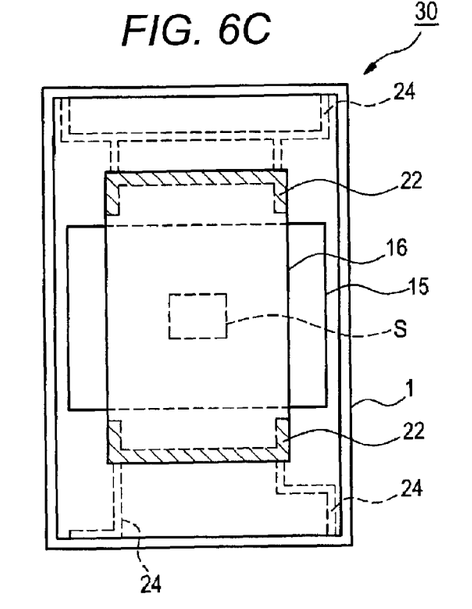

FIGS. 6A to 6C are plan views representing the procedure of producing a solid-state image sensor.

As shown in FIG. 6A, on a substrate 1, a sensor region S is formed, and a connection portion 22 and a wiring layer 24 are formed in a circumference region. At this time, two connection portions 22 are formed in the circumference region. The wiring portion 24, in the plan view of the substrate 1, is formed in a band shape so as to extend from the circumference edge of the substrate 1 to a position overlapping with a portion in which the connection portion 22 is formed. In addition, two connection portions 22 are disposed in a symmetrical arrangement with respect to the sensor region. In other words, the sensor region S is formed in the center of the two connection portions 22 so as to be positioned at an equal distance from the connection portions 22.

In this configuration, in the solid-state image sensor 30, the distance from each connection portion 22 to the sensor region S is almost equal. Thus, when an electric field is applied between the upper electrode 16 and the lower electrode 14, a uniform voltage may be applied to the photoelectric conversion layer 15. Therefore, deterioration of image quality due to unevenness or the like in an image may be prevented.

Thereafter, as shown in FIG. 6B, a photoelectric conversion layer 15 is deposited on the substrate so as to cover the sensor region S. The photoelectric conversion layer 15 is formed in an approximately rectangular shape in the plan view. Here, the region coated with the photoelectric conversion layer 15 is determined such that the sensor region S is located in the center of the photoelectric conversion layer 15.

In this configuration, deterioration of image quality due to unevenness or the like in an image may be further prevented.

As in this example, in the plan view of the substrate 1, since two connection portions 22 are formed in a shape surrounding the sensor region S, the two connection portions may be used for alignment of the disposition of the photoelectric conversion layer 15. Accordingly, the position of the photoelectric conversion layer 15 may be easily determined. In addition, since the two connection portions 22 are located in a region other than a sensor region, the photoelectric conversion layer 15 is easily deposited in sensor region and not in connection portions 22.

As shown in FIG. 6C, an upper electrode 16 is formed on the photoelectric conversion layer 15, and a part of the upper electrode 16 overlaps with a part of the photoelectric conversion layer 15. The upper electrode 16 has an approximately rectangular shape in the plan view of the substrate 1. In addition, in the plan view of the substrate 1, the sensor region is located in the center of the upper electrode 16.

The two connection portions 22 are formed in positions almost overlapping with the two shorter sides of the upper electrode 16 that face each other. However, depending on the disposition of the upper electrode 16, the two connection portions 22 may be disposed in positions corresponding to the two longer sides of the upper electrode 16 that face each other.

According to the above-described configuration, in the solid-state image sensor 30, the distance from each connection portion 22 to the sensor region S is almost equal. Thus, when an electric field is applied between the upper electrode 16 and the lower electrode 14, a uniform voltage may be applied to the photoelectric conversion layer 15. Therefore, deterioration of image quality due to unevenness or the like in an image may be prevented. Furthermore, since the sensor region S is located in the center of the photoelectric conversion layer 15, the image quality becomes better.

The shapes of the two connection portions 22 are not limited abovementioned, as long as they are symmetrical with respect to the sensor region S and have the same shape. In addition, as described below, the positions or the numbers of the connection portions 22 may be appropriately changed.

Figure 7:
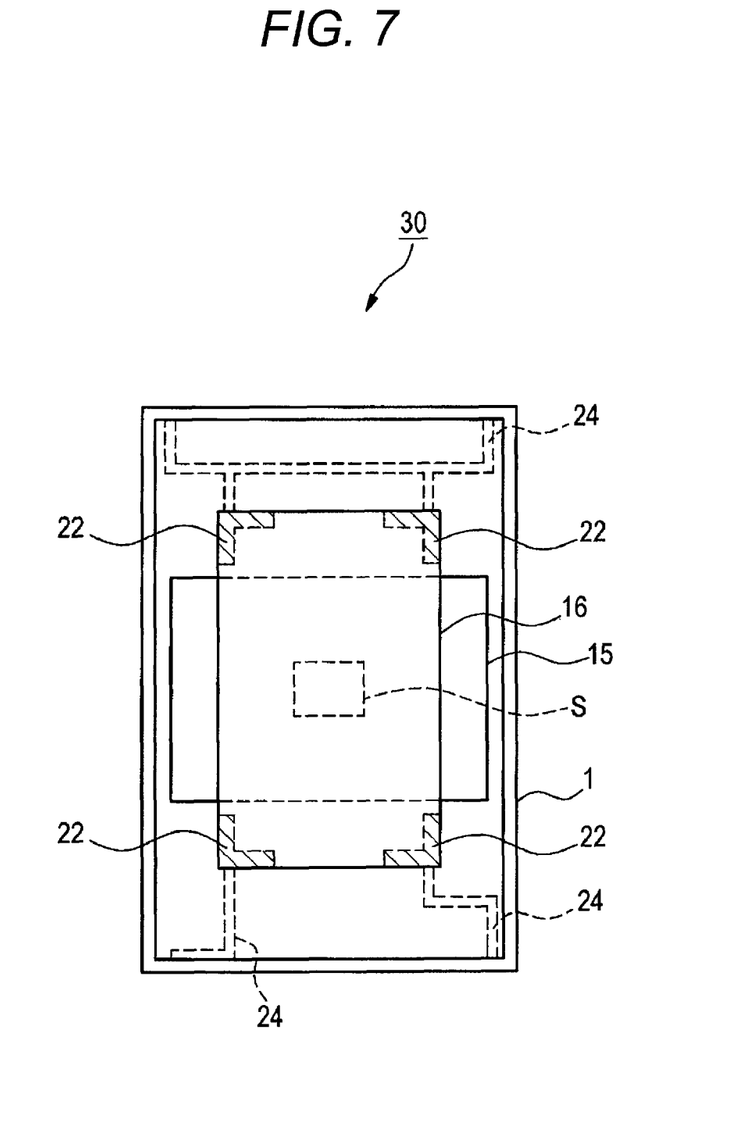
FIG. 7 is a plan view representing another example of a solid-state image sensor.

FIG. 7 is a plan view representing another example of a solid-state image sensor. In this example, in the plan view of the substrate 1, in positions corresponding to the four corners of the upper electrode 16, connection portions 22 are formed each having a letter "L" shape. Also in this example, similarly to the above-described solid-state image sensor, four connection portions 22 are disposed so as to be symmetrical with respect to the sensor region S. As in this example, by using a configuration in which a voltage is supplied from the four corners of the upper electrodes 16 by the connection portions 22, in a case where a high voltage is supplied from an outside power source, the voltage may be supplied to the four corners of the upper electrode 16 from the wiring portions 24 located on the four corners of chip. In addition, by forming the connection portions 22 disposed on each corner to have a letter "L" shape, the connection portions 22 may be used as alignment marks at the time of production. The shape of the connection portion 22 is not particularly limited.

Figure 8:
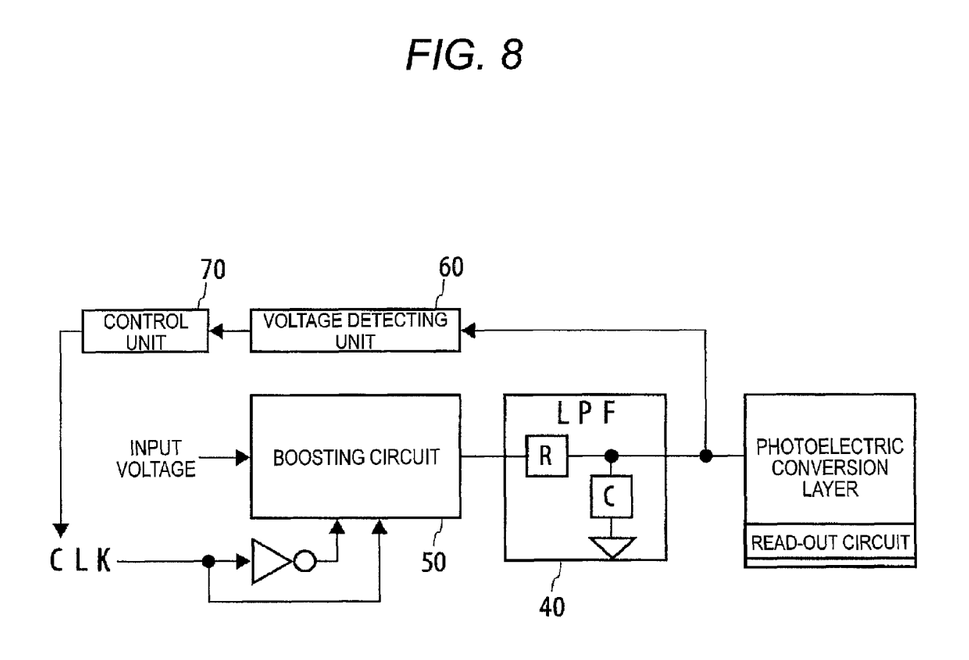
FIG. 8 is a block diagram representing an example of driving a solid-state image sensor.

FIG. 8 is a block diagram representing an example of driving a solid-state image sensor.

A voltage boosting circuit 50 raises the input voltage through a voltage boosting operation so as to generate a driving voltage and outputs the generated driving voltage to a low pass filter 40. The low pass filter 40 blocks power source noise included in the driving voltage and supplies the driving voltage to a photoelectric conversion layer through a wiring portion and an upper electrode. When light is incident to the photoelectric conversion layer from the outside in the state in which an electric field is applied to the upper electrode and a lower electrode, an electric charge is generated inside the photoelectric conversion layer, and the electric charge is read out by a read-out circuit through the lower electrode 14 and is output as an output signal.

In addition, in the solid-state image sensor, a voltage detecting unit 60 is disposed that is connected to the output of the low pass filter 40 and serves as a voltage detecting means that detects a power source voltage output from the voltage boosting circuit 50. In addition, a control unit 70 that sets the clock frequency of the voltage boosting circuit such that the voltage detected by the voltage detecting unit 60 is within a predetermined range and controls the clock frequency input to the voltage boosting circuit 50 to be the set clock frequency is included in the solid-state image sensor.

Figure 9:
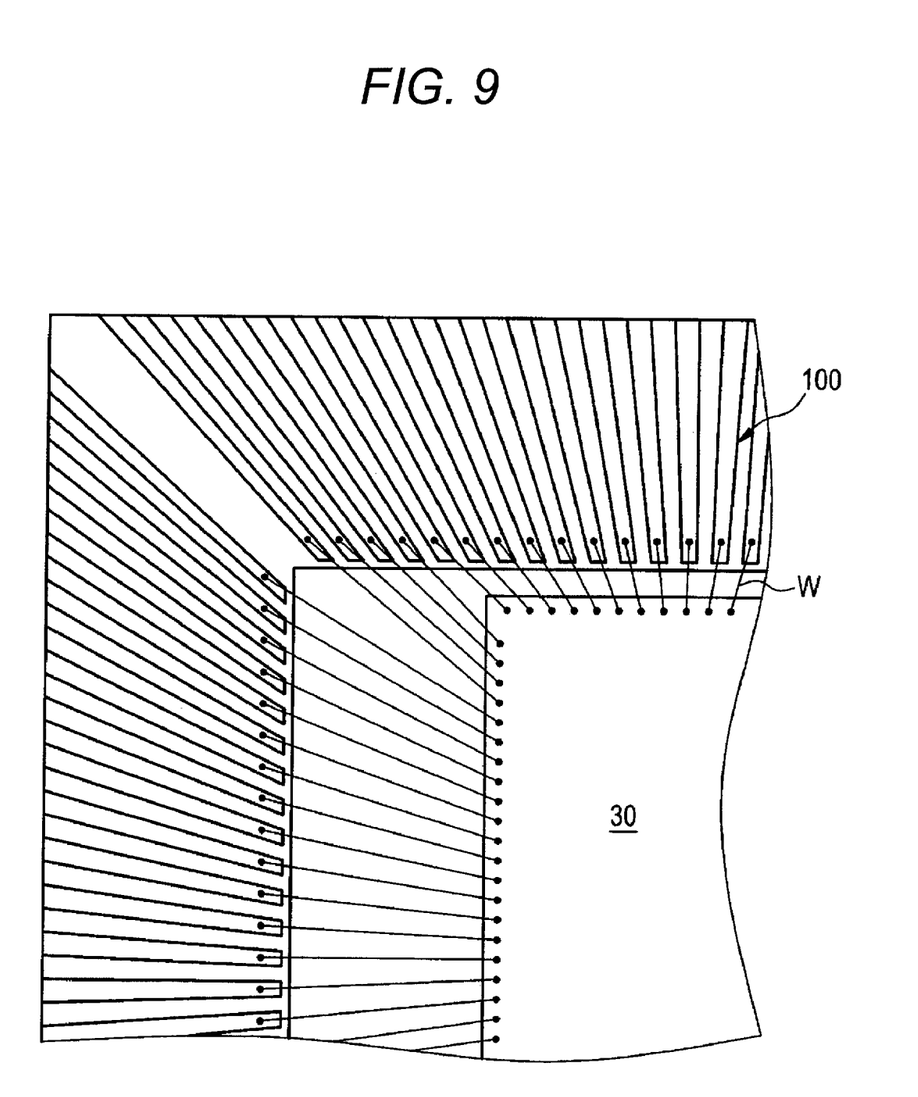
FIG. 9 is a diagram showing a state in which a solid-state image sensor is mounted in a package.

FIG. 9 is a diagram showing a state in which a solid-state image sensor is mounted in a package.

When a voltage is applied to the solid-state image sensor 30 from the outside, the solid-state image sensor 30 is used by being mounted in the package 100 which is a semiconductor chip. The package 100 has a wiring substrate in which a plurality of electrodes aligned in correspondence with a plurality of electrodes disposed on outer circumference portions of the four sides of the solid-state image sensor is disposed. The electrodes located on the outer circumference portions of the solid-state image sensor 30 and the electrodes of the wiring substrate are electrically connected to each other through wires W. FIG. 9 shows only a part of the configuration of the outer circumference portion of the solid-state image sensor 30. The solid-state image sensor 30 is supplied with a voltage from the electrodes located in the outer circumference portions through the wires W from the package 100 side. According to this configuration, a high voltage may be supplied to the package from the outside. At this time, the electrodes of the package are appropriately spaced by setting the interval of the adjacent electrodes by using the four corners as much as possible, and accordingly, the electrodes are configured so as not to form a short circuit with other power sources, GND, or a low-voltage signal.

DESCRIPTION OF REFERENCE NUMERALS AND SIGNS

1: SUBSTRATE
15: PHOTOELECTRIC CONVERSION LAYER
16: UPPER ELECTRODE
22: CONNECTION PORTION
24: WIRING PORTION
30: SOLID-STATE IMAGE SENSOR

What is claimed is:

1. A solid-state image sensor having a plurality of pixels with corresponding plurality of photoelectric conversion elements, the plurality of pixels and corresponding photoelectric elements being disposed in an array on a plane having an x-axis and a y-axis, the solid-state image sensor comprising:
    a plurality of lower electrodes that respectively corresponds to the plurality of pixels;
    a photoelectric conversion layer stacked on the lower electrodes;
    a sensor region in which each of the plurality of photoelectric conversion elements is positioned, the sensor region has a center point positioned at the intersection of the x-axis and the y-axis;
    an upper electrode stacked on the photoelectric conversion layer;
    a wiring portion capable of supplying a voltage to the upper electrode to generate an electric field between the upper electrode and the lower electrode; and a plurality of connection portions connecting the wiring portion and the upper electrode, the plurality of connection portions being disposed in a circumference region which is a region other than the sensor region, each of the photoelectric conversion elements including one of the lower electrodes, a part of the photoelectric conversion layer corresponding to the one of the lower electrodes and a part of the upper electrode corresponding to the one of the lower electrodes, wherein the plurality of connection portions is disposed in a symmetrical arrangement with respect to the x-axis and also in a symmetrical arrangement with respect to the y-axis so as to achieve a four-fold symmetrical arrangement relative to the center point of the sensor region, and wherein the upper electrode envelopes the plurality of connection portions.

2. The solid-state image sensor according to claim 1, wherein the number of the connection portions is two, and wherein the connection portions are disposed in positions corresponding to each side of the upper electrode that face each other.

3. The solid-state image sensor according to claim 1, wherein the number of the connection portions is four, and wherein the connection portions are disposed in positions corresponding to the four corners of the upper electrode.

4. The solid-state image sensor according to claim 1, further comprising:
 a voltage boosting unit configured to output a voltage to the wiring portion and receive a clock signal;
 a voltage detecting unit configured to detect the voltage output from the voltage boosting unit; and
 a control unit configured to control a clock frequency of the clock signal so that the voltage detected by the voltage detecting unit is within a given range.

5. The solid-state image sensor according to claim 1, wherein the wiring portion contains two or more layers in the circumference region.

6. The solid-state image sensor according to claim 1, wherein the connection portions are made of a material having resistivity that is equal to or greater than $1\times10^{-7}$ Ωm.

7. The solid-state image sensor according to claim 1, wherein the connection portions are made of titanium nitride or indium tin oxide.

8. The solid-state image sensor according to claim 1, wherein the connection portion is composed of the same conductive material as the lower electrodes.

9. The solid-state image sensor according to claim 1, wherein the upper electrode is made of ITO.

10. The solid-state image sensor according to claim 1, wherein the photoelectric conversion layer includes an organic photoelectric conversion material.

11. The solid-state image sensor according to claim 1, further comprising:
 a floating diffusion whose electric potential is capable of changing in accordance with an electric potential of the lower electrode; and
 a source-follower transistor that converts the electric potential of the floating diffusion into a voltage signal and outputs the voltage signal.

12. The solid-state image sensor according to claim 1, wherein the plurality of the connection portions has a letter "L" shape in the plan view.

13. The solid-state image sensor according to claim 1, wherein the plurality of the connection portions is formed to have a shape surrounding the sensor region.

14. The solid-state image sensor according to claim 1, wherein the sensor region is located in the center of the photoelectric conversion layer.

15. An imaging device comprising a solid-state image sensor having a plurality of pixels, the solid-state image sensor, the plurality of pixels having a corresponding plurality of photoelectric conversion elements, the plurality of pixels and corresponding photoelectric elements being disposed in an array on a plane having an x-axis and a y-axis, includes:
 a plurality of lower electrode that respectively correspond to the plurality of pixels;
 a photoelectric conversion layer that is stacked on the lower electrodes;
 a sensor region in which each of the plurality of photoelectric conversion elements is positioned, the sensor region has a center point positioned at the intersection of the x-axis and the y-axis;
 an upper electrode stacked on the photoelectric conversion layer;
 a wiring portion capable of supplying a voltage to the upper electrode to generate an electric field between the upper electrode and the lower electrode; and
 a plurality of connection portions connecting the wiring portion and the upper electrode, the plurality of connection portions being disposed in a circumference region which is a region other than the sensor region, each of the photoelectric conversion elements including one of the lower electrodes, a part of the photoelectric conversion layer corresponding to the one of the lower electrodes and a part of the upper electrode corresponding to the one of the lower electrodes,
 wherein the plurality of connection portions is disposed in a symmetrical arrangement with respect to the x-axis and also in a symmetrical arrangement with respect to the y-axis so as to achieve a four-fold symmetrical arrangement relative to the center point of the sensor region, and
 wherein the upper electrode envelopes the plurality of connection portions.

16. An imaging device according to claim 15, wherein the sensor region is located in a center face region of the photoelectric conversion layer.

* * * * *